United States Patent [19]
Tubbs et al.

[11] 4,295,897
[45] Oct. 20, 1981

[54] METHOD OF MAKING CMOS INTEGRATED CIRCUIT DEVICE

[75] Inventors: Graham S. Tubbs, Houston; James E. Ponder, Cat Spring, both of Tex.

[73] Assignee: Texas Instruments Incorporated, Dallas, Tex.

[21] Appl. No.: 81,513

[22] Filed: Oct. 3, 1979

[51] Int. Cl.³ .................... H01L 21/22; H01L 29/78
[52] U.S. Cl. ................................. 148/1.5; 148/187; 357/23; 357/42; 357/91
[58] Field of Search ................... 148/1.5, 187; 357/23, 357/42, 91, 59; 29/571

[56] References Cited

U.S. PATENT DOCUMENTS

| | | | |
|---|---|---|---|
| 4,013,484 | 3/1977 | Boleky et al. | 148/1.5 |
| 4,045,250 | 8/1977 | Dingwall | 148/1.5 |
| 4,135,955 | 1/1979 | Gasner et al. | 148/187 |
| 4,139,402 | 2/1979 | Steinmaier et al. | 148/188 |
| 4,205,342 | 5/1980 | Darwish et al. | 357/23 |
| 4,210,465 | 7/1980 | Brower | 148/1.5 |
| 4,217,149 | 8/1980 | Sawazaki | 148/1.5 |

OTHER PUBLICATIONS

Chang et al., IBM-TDB, vol. 16, (1973) 1635.

*Primary Examiner*—Upendra Roy
*Attorney, Agent, or Firm*—John G. Graham

[57] ABSTRACT

An improved CMOS device and method of making it are provided which utilize basically the standard N-channel self-aligned silicon gate structure and process, modified to include a P-channel transistor. A P-type substrate is used as the starting material, with an N-type tank formed for the P-channel transistor. Field oxide is grown after the N-type tank is formed. A polycrystalline silicon layer is deposited and patterned to create gates for both N- and P-channel transistors, then separately masked P- and N-type diffusions or implants form the sources and drains for the two types of transistors.

4 Claims, 9 Drawing Figures

METHOD OF MAKING CMOS INTEGRATED CIRCUIT DEVICE

BACKGROUND OF THE INVENTION

This invention relates to integrated semiconductor devices and methods of manufacture, and more particularly to an improved method of making complementary insulated gate field effect (CMOS) transistors in integrated circuit form.

Complementary FET or "CMOS" devices have long been recognized as offering significant advantages in the area of low power consumption. However, most MOS memory and processor type devices now being manufactured are N-channel because of speed, circuit density and cost factors which heretofore have favored NMOS over CMOS.

It is the principal object of this invention to provide improved CMOS integrated circuit devices and an improved method of making such devices. Another object is to provide CMOS devices and methods of making devices which allow the speed advantage of N-channel transistors to be utilized. A further object is to provide CMOS devices of smaller size or higher circuit density, higher speed and/or lower cost.

SUMMARY OF THE INVENTION

In accordance with an embodiment of the invention, an improved CMOS device and method of making it are provided which utilize basically the standard N-channel self-aligned silicon gate structure and process, modified to include a P-channel transistor. A P-type substrate is used as the starting material, with an N-type tank formed for the P-channel transistor. Field oxide is grown after the N-type tank is formed. A polycrystalline silicon layer is deposited and patterned to create gates for both N- and P-channel transistors, then separately masked P- and N-type diffusions or implants form the sources and drains for the two types of transistors.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
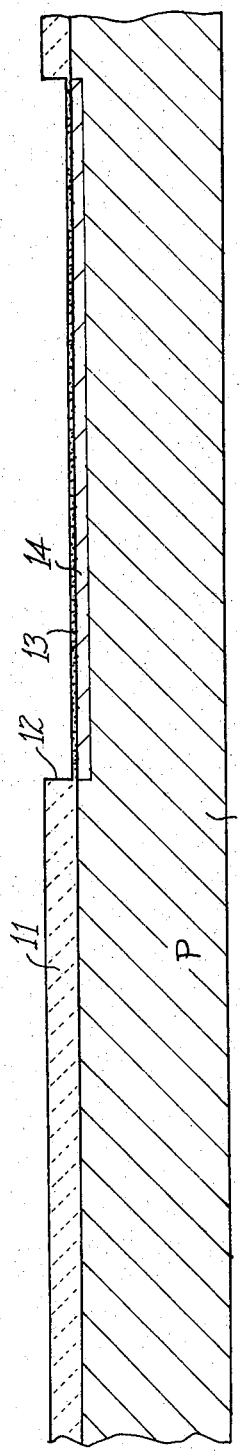
FIGS. 1–8 are elevation views in section of a small part of a semiconductor chip at successive stages of manufacture of two transistors, one P-channel and one N-channel.

A process for making CMOS devices according to the invention will be described with reference to FIGS. 1–8. The starting material is a slice of P-type silicon doped in growing to a resistivity of about 15 ohm-cm. The segment 10 of the slice seen in the figures contains two transistors and is only a very small part of what will be one bar, with the slice including perhaps two or three hundred bars. A processor device of the type used for a handheld calculator contains ten to twenty thousand transistors on a bar less than 150 mils on a side, so the transistors occupy less than about one mil in width. First, the slice is cleaned and a thick thermal oxide layer 11 is grown by maintaining the slice in steam at 900 Degrees C. for several hours, producing about 10,000 Angstroms thickness. A photoresist masking operation is used to etch the oxide layer 11 to bare silicon in locations 12 where P-channel transistors are to be formed. A thin layer 13 of thermal oxide may be regrown in the location 12 as seen in FIG. 1 to avoid implant damage, but this is not required. The slice is subjected to a phosphorus ion implant at 150 KeV with a dosage of about $3 \times 10^{12}$ per sq. cm. to produce a shallow implanted region 14 in the location 12; the thick silicon oxide masks the implant.

Figure 2:
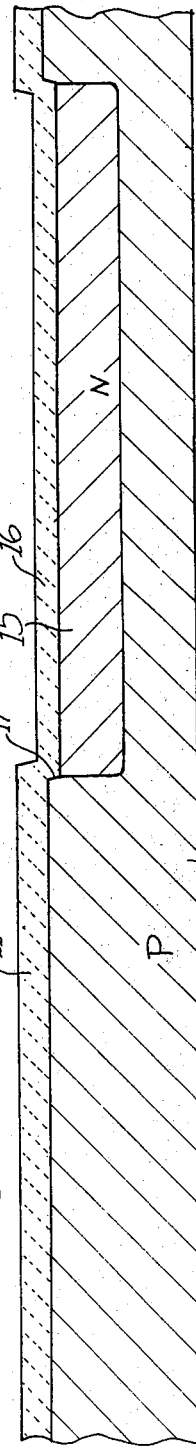

Referring now to FIG. 2, the next step is the N diffusion or tank drive. The slice is held in a tube furnace at a high temperature of about 1200 Degrees C. to drive the implanted phosphorus into the silicon to produce a region 15 with a junction depth of about 5 microns. Part of the time in the furnace is in a steam atmosphere so a thermal oxide layer 16 of about 8000 Angstroms is grown while the original layer 11 grows somewhat thicker. Silicon is consumed by the oxidation, but due to the masking effect of the remaining oxide layer 11, the growth rate differential produces a step 17 in the surface which will be needed for subsequent alignment.

Figure 3:
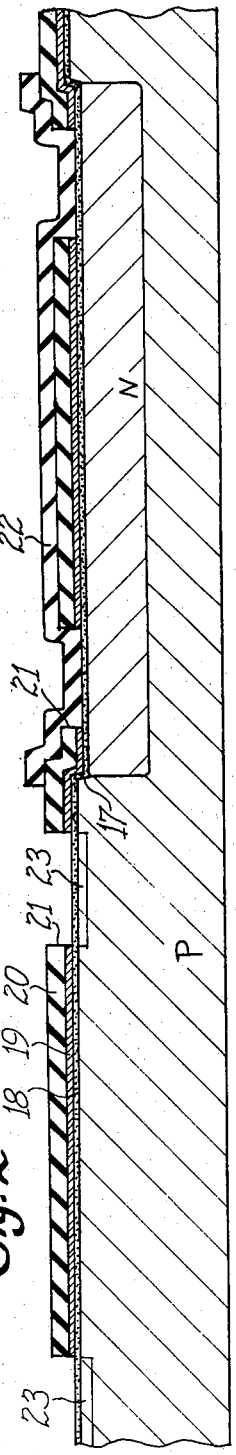

Turning now to FIG. 3, the next step is removal of all of the oxide layers 11 and 16 from the slice, leaving the step 17 of about 2000 Angstroms, then a thin thermal oxide layer 18 is regrown to about 1000 Angstroms. A layer 19 of silicon nitride is then deposited over the thermal oxide. A coating 20 of photoresist is deposited and exposed to light through a mask which defines the areas of thick field oxide, so upon developing holes 21 are left in the photoresist, and an etchant then removes the nitride layer 19 at the holes 21. Next, another layer 22 of photoresist is deposited and exposed to light through a mask which defines the N-type tank regions 15 so upon developing the resist all the tank areas remain covered; the mask used for this photoresist is essentially a color reversal of the tank mask. Using the two photoresist layers as a mask, a boron implant of about $5 \times 10^{12}$ per cm. sq. at 100 KeV produces P+ regions 23 where channel stops are to be formed. To cure implant damages, a nitrogen anneal is performed as set forth in U.S. Pat. No. 4,055,444 issued to G. R. Mohan Rao, assigned to Texas Instruments.

Figure 4:
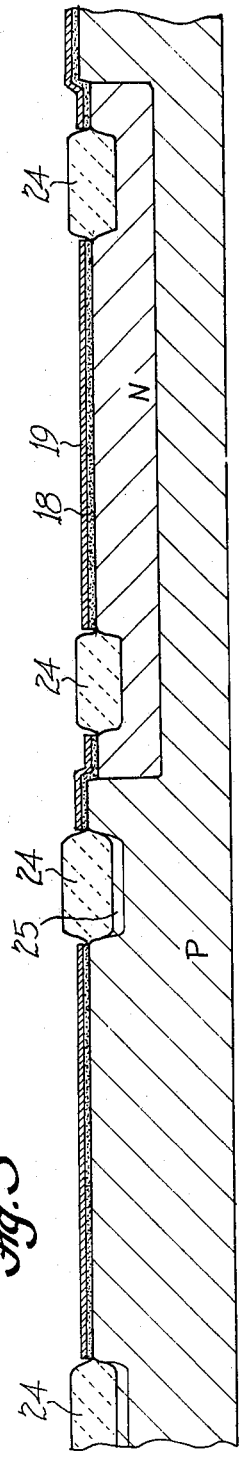

As will be seen in FIG. 4, after removing photoresist a thermal oxidation step at 900 Degrees C. in steam produces a field oxide coating 24 in all areas not masked by the nitride. The oxide thickness is about 9000 Angstroms. Channel stop regions 25 are formed beneath the field oxide 24 by diffusion from the implanted P+ regions 23. Part of the implanted boron is consumed with the silicon upon oxidation, but part diffuses ahead of the oxidation front. No channel stop regions are needed beneath the field oxide in the N-type tank regions 15 because of the higher concentration of N-type impurities.

Figure 5:
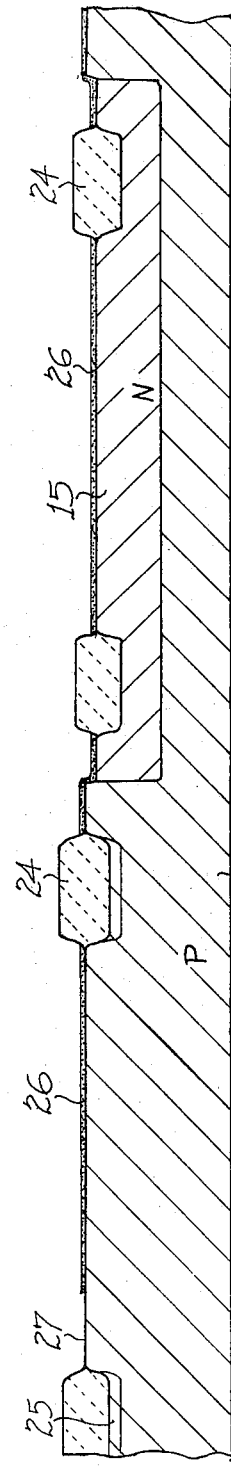

In FIG. 5, it is seen that the remaining nitride layer 19 and the oxide layer 18 are removed and another thin thermal oxide layer 26 is grown at about 950 Degrees C. in steam to a thickness of about 800 Angstroms. This layer 26 functions as the gate oxide. At locations 27 where polysilicon-to-silicon contact is to be made, the oxide 26 is removed using a photoresist operation.

Figure 6:
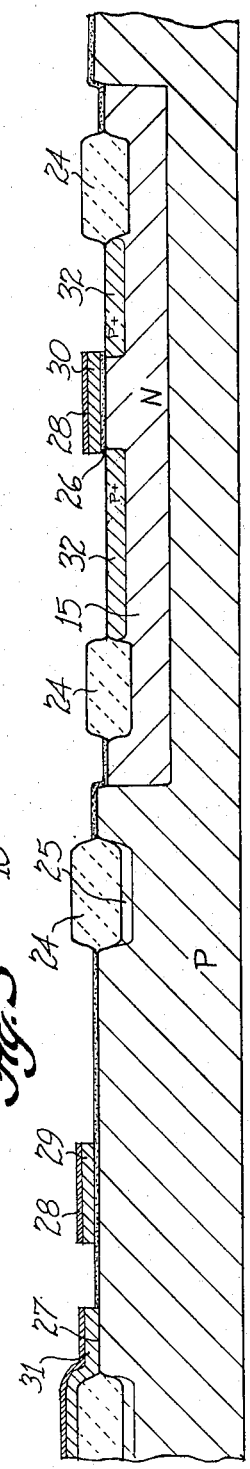

With reference to FIG. 6, the next step in the process is deposition of a polycrystalline silicon layer over the entire top surface of the slice to form the gates of the transistors and certain interconnections. A coating 28 of silicon nitride is then deposited over the polysilicon, and a coating of photoresist is added over the nitride. The photoresist is exposed to light through a mask which defines the gates 29 and 30 and interconnection 31, then the slice is etched to remove uncovered nitride, then another photoresist operation is used to remove the thin oxide 26 where boron is to be implanted in the N-type tank region 15. Then, using the photoresist, nitride and field oxide as masking material, an ion implant at 50 KeV, $8 \times 10^{15}$ dosage, produces the P+ type source and drain regions 32.

Figure 7:
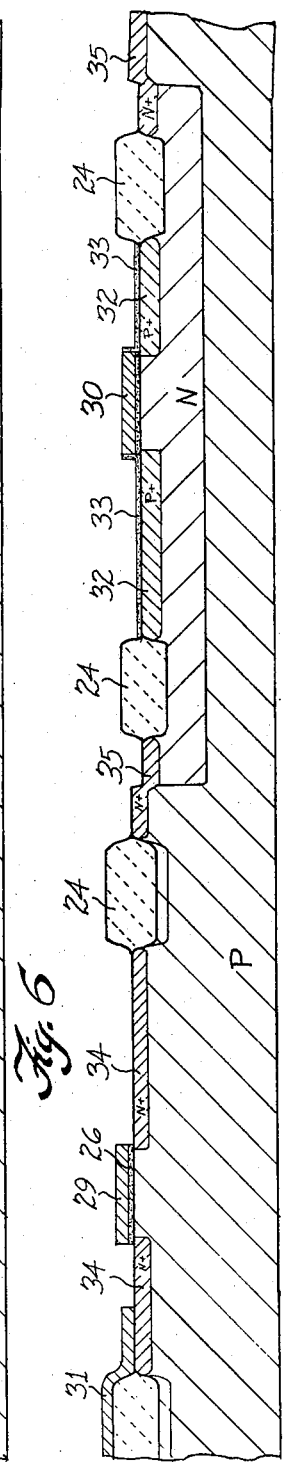

FIG. 7 shows the device after a thermal oxide layer 33 of about 3000 Angstroms is grown to mask the N+ implant. A photoresist mask and etch operation removes the oxide 33 and oxide 26 everywhere except over the P+ regions 32. Next, the nitride coating 28 is removed from the polysilicon, an operation not requiring photoresist. A phosphorus implant of $7 \times 10^{15}$ dosage at 40 KeV produces N+ source and drain regions 34 for the N-channel transistor and an N+ guard ring region 35 around the N-type tank region 15, as well as doping the polysilicon to make it conductive. A high temperature operation drives in the phosphorus, and also grows thermal oxide.

Figure 8:
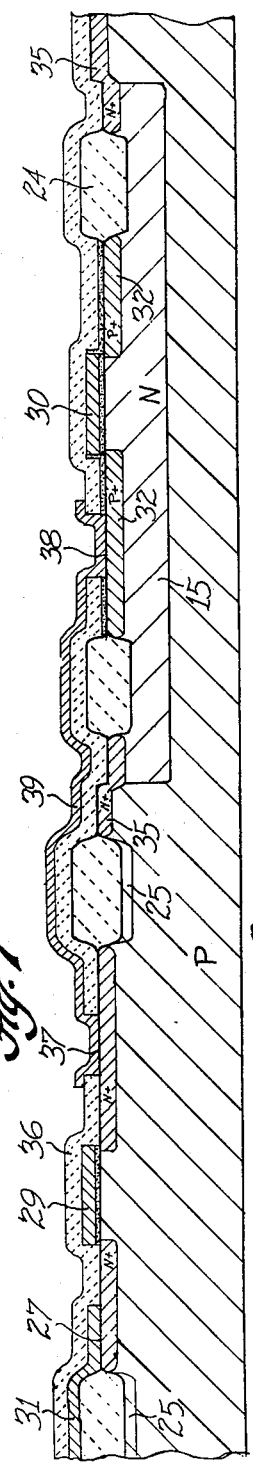
Figure 9:
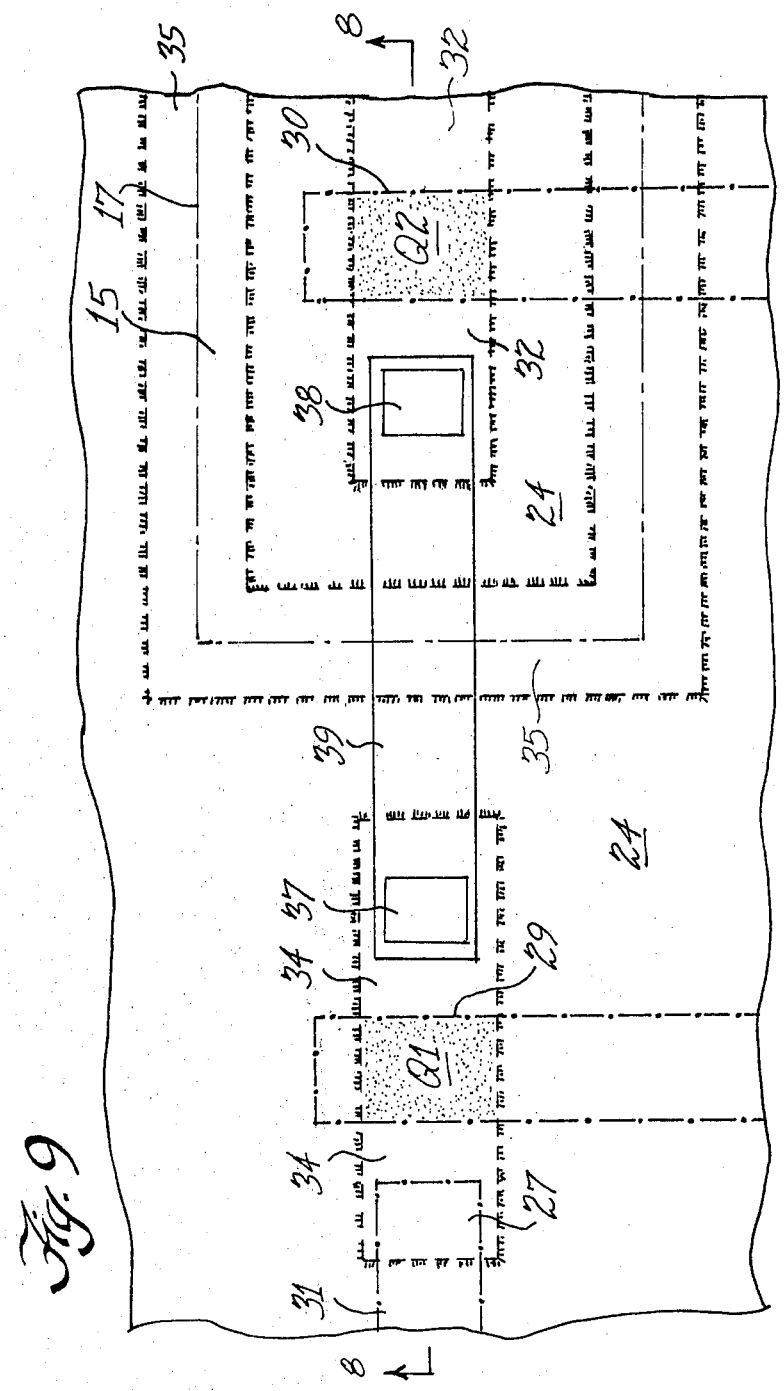
FIG. 9 is a plan view of the completed chip of FIG. 8.

Turning now to FIG. 8, the next step is deposition of an interlevel oxide layer 36 to a thickness of about 6000 Angstroms. This is done at a relatively low temperature by decomposition of silane. The layer 36 is then densified by heating at 1000 Degrees C. in a nonoxidizing atmosphere. The oxide layer 36 is patterned by a photoresist operation to open holes at contact areas 37 and 38 where metal-to-silicon contacts are to be made. An aluminum film is deposited over the entire top surface of the slice then patterned to leave only the metal interconnections such as the strip 39. A protective overcoat (not shown) is added and the slice scribed and broken into individual bars which are mounted in packages.

The CMOS transistors Q1 and Q2 thus produced have certain advantages over devices made by earlier methods. By starting with a P-type substrate 10 and diffusing N-type tanks 15 instead of starting with an N type substrate and diffusing P-type tanks, provides an improvement related to switching speed. N-channel transistors have a speed advantage over P-channel due to the inherent mobility difference between electrons and holes, but this advantage is offset in prior devices because of the higher tank concentration, resulting in N-channel and P-channel transistors with about the same switching speed. In some cases this may be preferred, but for high performance products all parts of the circuitry requiring high speed are designed in N-channel exclusively while the slow speed power saving parts of the circuit use P-channel.

Another feature of the process described above is that the polysilicon gates and interconnects are all N+ doped, rather than some N+ and other P+ as in prior silicon-gate self-aligned CMOS devices. This feature simplifies running polysilicon interconnects from N-channel to P-channel transistors.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A method of making complementary insulated gate field effect transistors in an integrated circuit comprising the steps of:
   (a) introducing N-type impurity into a selected area of a face of a P-type semiconductor body to provide a tank region for forming a P-channel transistor,
   (b) selectively growing thick field oxide using an oxidation mask to provide a first enclosed surface area on said face spaced from said tank region and a second enclosed surface area on said face within said tank region,
   (c) depositing a layer of polycrystalline silicon on said face over a thin gate insulator and patterning the polycrystalline silicon to provide a gate of an N-channel transistor in said first surface area and a gate of a P-channel transistor in said second surface area,
   (d) introducing P-type impurity into the second surface area to produce source and drain regions of the P-channel transistor while masking the first surface area,
   (e) and introducing N-type impurity into the first surface area to produce source and drain regions of the N-channel transistor while making said second surface area, both the gate of the N-channel transistor and the gate of the P-channel transistor being doped with N-type impurity upon the step of introducing N-type impurity into the first surface area.

2. A method according to claim 1 wherein a layer of silicon nitride is applied over the layer of polycrystalline silicon before patterning and is removed before introducing N-type impurity into the first surface area.

3. A method of making complementary insulated gate field effect transistors in an integrated circuit comprising the steps of:
   (a) introducing N-type impurity into a selected area of a face of a P-type semiconductor body to provide a tank region for forming a P-channel transistor, the step of introducing N-type impurity into said selected area including heating in an oxidizing atmosphere whereby said selected area is heavily oxidized to consume part of said surface area and produce a discontinuity in the surface to use for alignment,
   (b) selectively growing thick field oxide using an oxidation mask to provide a first enclosed surface area on said face spaced from said tank region and a second enclosed surface area on said face within said tank region,
   (c) depositing a layer of conductive material on said face over a thin gate insulator and patterning the conductive material to provide a gate of an N-channel transistor in said first surface area and a gate of a P-channel transistor in said second surface area,
   (d) introducing P-type impurity into the second surface area to produce source and drain regions of the P-channel transistors while masking the first surface area,
   (e) and introducing N-type impurity into the first surface area to produce source and drain regions of the N-channel transistor while masking said second surface area.

4. A method of making complementary insulated gate field effect transistors in an integrated circuit comprising the steps of:
   (a) introducing N-type impurity into a selected area of a face of a P-type semiconductor body to provide a tank region for forming a P-channel transistor,
   (b) selectively growing thick field oxide using an oxidation mask to provide a first enclosed surface area on said face spaced from said tank region and a second enclosed surface area on said face within said tank region, said oxidation mask being deposited as a coating over said face, a photoresist mask being used to remove a first part of said coating around said first surface area and a second part of said coating around said second surface area, and another photoresist mask being used to cover said second part and said second surface area while P-type impurity is introduced at said first part to produce a channel stop beneath the field oxide around the first surface area but not the second surface area,
   (c) depositing a layer of conductive material on said face over a thin gate insulator and patterning the conductive material to provide a gate of an N-channel transistor in said first surface area and a gate of a P-channel transistor in said second surface area,
   (d) introducing P-type impurity into the second surface area to produce source and drain regions of the P-channel transistor while masking the first surface area,
   (e) and introducing N-type impurity into the first surface area to produce source and drain regions of the N-channel transistor while masking said second surface area.

* * * * *

REEXAMINATION CERTIFICATE (3316th)

United States Patent [19]
Tubbs et al.

[11] B1 4,295,897
[45] Certificate Issued Sep. 9, 1997

[54] METHOD OF MAKING CMOS INTEGRATED CIRCUIT DEVICE

[75] Inventors: Graham S. Tubbs, Houston; James E. Ponder, Cat Spring, both of Tex.

[73] Assignee: Texas Instruments, Inc., Dallas, Tex.

Reexamination Request:
No. 90/004,250, May 28, 1996

Reexamination Certificate for:
Patent No.: 4,295,897
Issued: Oct. 20, 1981
Appl. No.: 81,513
Filed: Oct. 3, 1979

[51] Int. Cl.⁶ .................................... H01L 21/265
[52] U.S. Cl. ............... 148/1.5; 148/187; 148/DIG. 82; 357/23; 357/42; 357/91; 437/34; 437/69
[58] Field of Search ................... 437/34, 56, 57, 437/74, 75, 69, 58, 59; 148/DIG. 82

[56] References Cited

U.S. PATENT DOCUMENTS

Re. 31,079   11/1982   Nagasawa et al. .................. 29/571
3,865,654     2/1975   Chang et al. ........................ 437/34
4,027,380     6/1977   Deal et al. .......................... 437/34

FOREIGN PATENT DOCUMENTS

| 0029986 | 3/1974 | Japan . |
| 0015275 | 2/1977 | Japan . |
| 0086083 | 7/1977 | Japan . |
| 0103973 | 8/1977 | Japan . |

*Primary Examiner*—Tuan H. Nguyen

[57] ABSTRACT

An improved CMOS device and method of making it are provided which utilize basically the standard N-channel self-aligned silicon gate structure and process, modified to include a P-channel transistor. A P-type substrate is used as the starting material, with an N-type tank formed for the P-channel transistor. Field oxide is grown after the N-type tank is formed. A polycrystalline silicon layer is deposited and patterned to create gates for both N- and P-channel transistors, then separately masked P- and N-type diffusions or implants form the sources and drains for the two types of transistors.

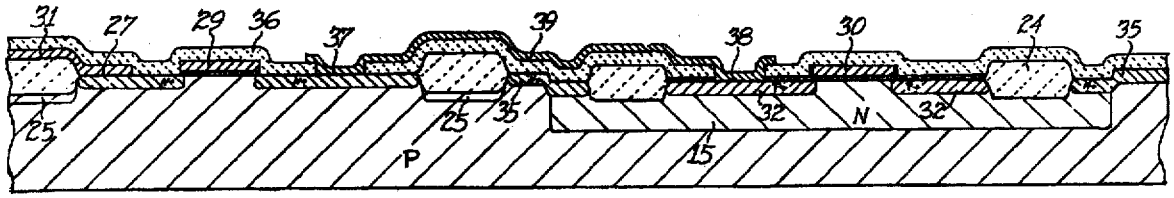

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 4 are cancelled.

Claims 2 and 3 are determined to be patentable as amended.

2. [A method according to claim 1] *A method of making complementary insulated gate field effect transistors in an integrated circuit comprising the steps of:*

(a) *introducing N-type impurity into a selected area of a face of a P-type semiconductor body to provide a tank region for forming a P-channel transistor, the step of introducing N-type impurity into said selected area including heating in an oxidizing atmosphere whereby said N-type impurity is driven into said P-type semiconductor body and said selected area is heavily oxidized to consume part of said surface area and produce a discontinuity in the surface,*

(b) *selectively growing thick field oxide using an oxidation mask to provide a first enclosed surface area on said face spaced from said tank region and a second enclosed surface area on said face within said tank region,*

(c) *depositing a layer of polycrystalline silicon on said face over a thin gate insulator and patterning the polycrystalline silicon to provide a gate of an N-channel transistor in said first surface area and a gate of a P-channel transistor in said second surface area,*

(d) *introducing P-type impurity into the second surface area to produce source and drain regions of the P-channel transistor while masking the first surface area,*

(e) *and introducing N-type impurity into the first surface area to produce source and drain regions of the N-channel transistor while making said second surface area, both the gate of the N-channel transistor and the gate of the P-channel transistor being doped with N-type impurity upon the step of introducing N-type impurity into the first surface area,* wherein a layer of silicon nitride is applied over the layer of polycrystalline silicon before patterning and is removed before introducing N-type impurity into the first surface area.

3. A method of making complementary insulated gate field effect transistors in an integrated circuit comprising the steps of:

(a) introducing N-type impurity into a selected area of a face of a P-type semiconductor body to provide a tank region for forming a P-channel transistor, the step of introducing N-type impurity into said selected area including heating in an oxidizing atmosphere whereby *said N-type impurity is driven into said P-type semiconductor body and* said selected area is heavily oxidized to consume part of said surface area and produce a discontinuity in the surface to use for alignment, (b) selectively growing thick field oxide using an oxidation mask to provide a first enclosed surface area on said face spaced from said tank region and a second enclosed surface area on said face within said tank region, (c) depositing a layer of conductive material on said face over a thin gate insulator and patterning the conductive material to provide a gate of an N-channel transistor in said first surface area and a gate of a P-channel tansistor in said second surface area, (d) introducing P-type impurity into the second surface area to produce source and drain regions of the P-channel transistors while masking the first surface area, (e) and introducing N-type impurity into the first surface area to produce source and drain regions of the N-channel transistor while masking said second surface area.

* * * * *